United States Patent [19]
Ohshima et al.

[11] Patent Number: 5,526,564
[45] Date of Patent: Jun. 18, 1996

[54] METHOD OF MANUFACTURING A MULTILAYERED PRINTED WIRING BOARD

[75] Inventors: Tutomu Ohshima; Hidebumi Ohnuki; Ryo Maniwa, all of Tokyo, Japan

[73] Assignee: NEC Corporation, Tokyo, Japan

[21] Appl. No.: 459,781

[22] Filed: Jun. 2, 1995

Related U.S. Application Data

[62] Division of Ser. No. 159,234, Nov. 30, 1993, Pat. No. 5,455,393.

[30] Foreign Application Priority Data

Nov. 30, 1992 [JP] Japan .................................. 4-319556

[51] Int. Cl.⁶ .................................................. H01K 3/10
[52] U.S. Cl. .............................. 29/852; 174/255; 29/846
[58] Field of Search .......................... 29/846, 847, 852; 361/792–795; 174/255

[56] References Cited

U.S. PATENT DOCUMENTS

| | | |
|---|---|---|
| 4,706,167 | 11/1987 | Sullivan . |
| 4,853,277 | 8/1989 | Chant .................... 174/255 |
| 4,893,216 | 1/1990 | Hagner . |
| 5,061,824 | 10/1991 | Alexander et al. . |
| 5,136,471 | 8/1992 | Inasaka . |
| 5,274,912 | 1/1994 | Olenick et al. .................... 29/846 |
| 5,313,021 | 5/1994 | Sajji et al. . |
| 5,320,894 | 6/1994 | Hasegawa . |

FOREIGN PATENT DOCUMENTS

| | | |
|---|---|---|
| 60-180197 | 9/1985 | Japan . |
| 62-259500 | 11/1987 | Japan . |
| 4148590 | 5/1992 | Japan . |

*Primary Examiner*—P. W. Echols
*Assistant Examiner*—Adrian L. Coley
*Attorney, Agent, or Firm*—Sughrue, Mion, Zinn, Macpeak & Seas

[57] ABSTRACT

A multilayered printed wiring board includes a plurality of inner layer circuits, ground layers, first insulating layers, a second insulating layer, a surface layer circuit, and a parts mounting pad. The inner layer circuits are arranged parallel to each other in a flat manner in at least one inner layer. The ground layers are formed on and under the inner layer circuits to sandwich the inner layer circuits. The first insulating layers are respectively formed between the ground layers and the inner layer circuits to insulate the inner layer circuits from each other and the inner layer circuits from the ground layers. The second insulating layer is formed at least on an uppermost one of the ground layers and serving as a surface layer. The surface layer circuit is selectively formed on the second insulating layer. The parts mounting pad is formed at a predetermined region on the second insulating layer, has a recessed portion for fitting a lead portion of a mounting part therein, and is connected to the surface layer circuit. A method of manufacturing this printed wiring board is also disclosed.

4 Claims, 4 Drawing Sheets

METHOD OF MANUFACTURING A MULTILAYERED PRINTED WIRING BOARD

This is a divisional of Application No. 08/159,234 filed Nov. 30, 1993 now U.S. Pat. No. 5,455,393.

BACKGROUND OF THE INVENTION

The present invention relates to a multilayered printed wiring board and a method of manufacturing the same and, more particularly, to a multilayered printed wiring board formed by alternating conductive layers and insulating layers and a method of manufacturing the same.

In recent years, along with the function-improving, downsizing, weight-reducing, and speed-increasing trends of electronic equipment, down-sized, high-speed electronic devices including LSIs have been developed. To cope with down-sized, multipin, high-speed electronic devices to be mounted, a printed wiring board is required to increase its wiring density, mounting density, and operating speed. Especially, in order to increase tile wiring density of the printed wiring board, a multilayered printed wiring board having an increased number of wiring layers is used to cope with this demand.

According to a conventional method of manufacturing a multilayered printed wiring board, the number of layers is increased by interposing a prepreg between inner layers in which circuits are formed in advance, and pressing the entire structure. However, the inner layers may be undesirably shifted by hot press, the positions of the inner layers may be deviated due to the expansion and contraction of the material, and the thickness of the board may be increased by increasing the number of layers, making it difficult to form through holes. Therefore, to increase the wiring density and the number of layers, strict process management and a large number of process steps are required.

In contrast to this conventional method of manufacturing a multilayered printed wiring board, there is another method of manufacturing a multilayered printed wiring board having a higher density and higher precision (e.g., Japanese Patent Laid-Open No. 60-180197). According to this method of manufacturing a multilayered printed wiring board, first, as shown in FIG. 3A, a board 1 having a first ground layer 2 formed on its upper surface is prepared.

Then, as shown in FIG. 3B, a photosensitive resin is coated on the entire surface of the first ground layer 2 of the board 1 and subjected to dry tact to form a photosensitive resin layer 3a. Subsequently, a photomask is applied on this structure, and exposure and development are performed, thereby forming a hole 16a for a prospective via hole in the photosensitive resin layer 3a.

As shown in FIG. 3C, the photosensitive resin layer 3a is hardened to form a first insulating layer 3. The surface of the first insulating layer 3 is chemically roughened for securing tight contact with an upper layer circuit, and circuits 6 and a via hole 16 are selectively formed on and in the first insulating layer 3.

As shown in FIG. 3D, a second insulating layer 8 is formed on the first insulating layer 3, the circuits 6, and the via hole 16 in the same manner as the first insulating layer 3.

As shown in FIG. 3E, the second insulating layer 8 is roughened, and a second ground layer 10 is formed on a portion of the second insulating layer 8 corresponding to the circuits 6. The circuits 6 sandwiched between the first and second ground layers 2 and 10 are formed in this manner.

When the number of layers is to be further increased, the steps including insulating layer formation to circuit formation shown in FIGS. 3B to 3E are repeated.

After a required number of inner layers are formed in this manner, as shown in FIG. 3F, a third insulating layer 11 is formed on the second insulating layer 8 and the second ground layer 10. The third insulating layer 11 is roughened, and the circuits of an uppermost layer are selectively formed. The uppermost layer has parts mounting pads 12. The parts mounting pads 12 are electrically connected to the ground layer 10 from their via holes 17 through the circuits on the uppermost layer.

Thereafter, as shown in FIG. 3G, a solder resist layer 13 is formed on the circuits of the uppermost layer excluding the parts mounting pads 12, and on the third insulating layer 11. If necessary, a solder 14 is supplied onto the parts mounting pads 12 by means of, e.g., a hot air leveler.

In the multilayered printed wiring board obtained in accordance with the above steps, since the number of layers is increased by the steps including photosensitive resin coating to circuit formation, the relative positional precision of the upper and lower layers is high compared to the conventional multilayered scheme employing hot press. Since the via holes are formed by lithography, the diameters of the via holes can be decreased, so that a high-density, high-precision multilayered printed wiring board can be manufactured.

However, the conventional multilayered printed wiring board described above has the following problems.

First, the solder 14 is usually supplied onto the parts mounting pads 12 by means of the hot air leveler or the like. With this method, however, the film thickness of the solder 14 on each parts mounting pad 12 is as small as 10 µm or less and varies largely. As the size of the electronic device is decreased, parts leads are formed at a smaller pitch and the size of the parts leads is decreased. In leads having a pitch of 0.4 mm or less, however, the variations in film thickness of the solder 14 described above cannot be neglected. A bridge is formed at a thick portion of the solder 14, and a lead is not soldered at a thin portion of the solder 14. Thus, an electronic device having leads having a pitch of 0.4 mm or less cannot be mounted.

Second, when the circuit density is increased, the gap between circuits becomes narrow accordingly. Then, however, a signal propagating through a circuit adversely affects an adjacent circuit, so that a desired signal cannot sometimes be transmitted. This phenomenon is called crosstalk.

The crosstalk is increased when the gap between adjacent circuits is small, as indicated by a curve X of the conventional multilayered printed wiring board shown in FIG. 4A, and when the traveling distance of the circuits that run parallel to each other is long, as indicated by a curve X of the conventional multilayered printed wiring board shown in FIG. 4B. Therefore, if a circuit pattern has a plurality of circuits, e.g., bus lines, that run parallel to each other for a long distance, crosstalk poses a serious problem. In the conventional multilayered printed wiring board, the circuits form strip lines sandwiched between the upper and lower ground layers. With these circuits, the circuit gap cannot be decreased due to the reason from the electric characteristics described above. As a result, high-density wiring cannot be obtained.

The shorter the rise and fall times of a signal flowing through a circuit, i.e., the higher the signal frequency, the higher crosstalk. Therefore, the conventional multilayered printed wiring board cannot be applied to a circuit in which a high-frequency digital signal flows.

SUMMARY OF THE INVENTION

It is an object of the present invention to provide a multilayered printed wiring board which can accommodate high-density mounting of electronic devices having leads having a small pitch, and a method of manufacturing the same.

It is another object of the present invention to provide a multilayered printed wiring board in which crosstalk between circuits is prevented, and a method of manufacturing the same.

It is still other object of the present invention to provide a multilayered printed wiring board that call be applied also to a circuit in which a high-frequency digital signal flows, and a method of manufacturing the same.

In order to achieve the above objects, according to the first aspect of the present invention, there is provided a multilayered printed wiring board comprising a plurality of inner layer circuits arranged parallel to each other in a flat manner in at least one inner layer, ground layers formed on and under the inner layer circuits to sandwich the inner layer circuits, first insulating layers respectively formed between the ground layers and the inner layer circuits to insulate the inner layer circuits from each other and the inner layer circuits from the ground layers, a second insulating layer formed at least on an uppermost one of the ground layers and serving as a surface layer, a surface layer circuit selectively formed on the second insulating layer, and a parts mounting pad, formed at a predetermined region on the second insulating layer, having a recessed portion for fitting a lead portion of a mounting part therein, and connected to the surface layer circuit.

According to the second aspect of the present invention, there is provided a method of manufacturing a multilayered printed wiring board, comprising the steps of forming a first insulating layer on a board on which a first ground layer is formed, selectively forming a first circuit pattern on the first insulating layer, forming a second insulating layer on the first insulating layer and the first circuit pattern, forming a second ground layer on the second insulating layer to oppose the first ground layer, coating a resin on the second ground layer and the second insulating layer, selectively forming a hole in the resin and hardening the resin, thereby forming a third insulating layer serving as a surface layer, flattening the third insulating layer by polishing and roughening the third insulating layer, and selectively forming a second circuit pattern on the third insulating layer which has been roughened and forming a parts mounting pad having a recessed portion at a region of the third insulating layer where the hole is formed.

DESCRIPTION OF THE PREFERRED EMBODIMENTS

The preferred embodiments of the present invention will be described with reference to the accompanying drawings.

FIG. 1A to 1I are sectional views showing a method of manufacturing a multilayered printed wiring board according to the first embodiment of the present invention in the order of steps to be explained.

Figure 1A:
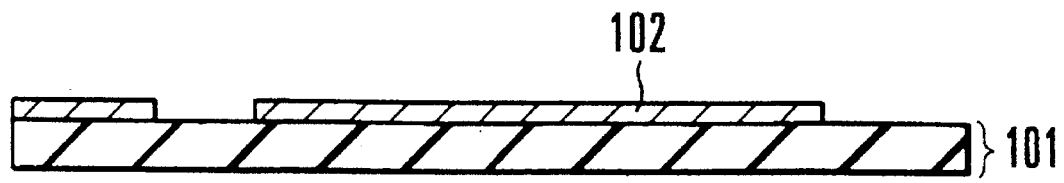
FIG. 1A to 1I are sectional views showing a method of manufacturing a multilayered printed wiring board according to the first embodiment of the present invention in the order of steps to be explained.

According to the first embodiment, as shown in FIG. 1A, a board 101 having a first ground layer 102 formed on its upper surface is fabricated. A copper-clad laminate may be used as the board 101, a hole may be formed in the laminate, and the laminate may be plated and etched to form a circuit, thereby providing a printed wiring board having a through hole. Alternatively, a metal board made of, e.g., Cu or Al may be used as the board 101, an epoxy resin may be coated on the upper surface of the board 101, the surface of the resultant board 101 may be toughened, and a circuit may be formed on the epoxy resin, thereby providing a printed wiring board. According to the first embodiment, a printed wiring board obtained by adhering a 18-μm thick copper foil on a 1.2-mm thick glass epoxy plate, and etching the glass epoxy plate in accordance with the subtractive scheme, thus forming a ground layer 102, is used.

Subsequently, a photosensitive resin is coated on the board 101 to a thickness of about 150 μm. To prepare the photosensitive resin, a photosensitive group is introduced to an epoxy resin in order to obtain an acrylic modified epoxy resin to be used as the main material, and a hardening agent and a solvent for viscosity adjustment are mixed with this main material. The photosensitive resin may be coated by screen printing, spraying, curtain coating, roll coating, dipping, or the like. According to the first embodiment, curtain coating is employed. Leveling is performed for 15 minutes, and dry tack is performed at 80° C. for 1 hour.

Then, a mask film is superposed on the resultant structure, and exposure is performed at 7 J/cm$^2$ by a metal halide lamp. At this time, a groove pattern having a width of 100 μm and a pitch of 300 μm and parallel to the circuit above it is formed in the mask film.

Figure 1B:
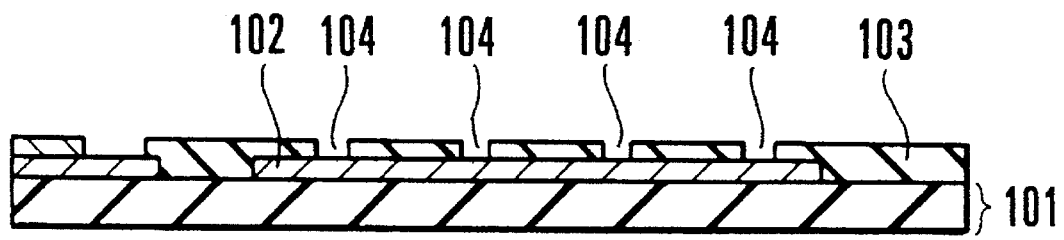

As shown in FIG. 1B, non-exposed portions are dissolved by an organic solvent containing cyclohexanone to form at least a pair of first parallel grooves 104, and the structure is heated at 140° C. for 1 hour to harden the photosensitive resin, thereby forming a first insulating layer 103 having a thickness of about 50 μm. The insulating layer 103 is subjected to buffing to flatten the surface of the first insulating layer 103. Buffing is performed with a buff roll of about No. 400 at a frequency of 500 to 3,000 rpm at least twice by changing the direction of the board 101 with respect to the buff roll by 90°, thereby obtaining a flat surface with a non-uniformity of 1 μm or less. Hence, the thickness of the first insulating layer 103 is about 40 μm.

Figure 1C:
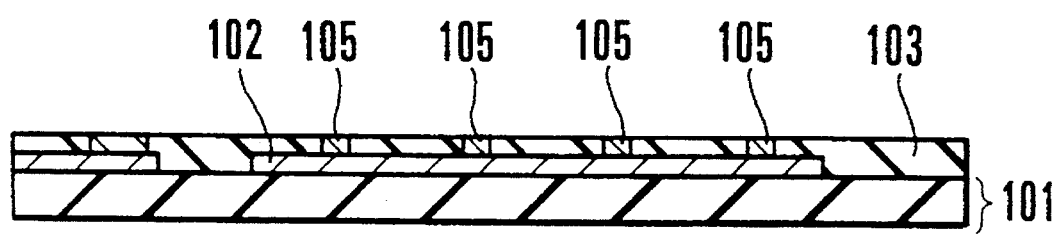

As shown in FIG. 1C, electroless copper plating is performed. As a result, first plated copper 105 is deposited in the first grooves 104 by using the underlying ground layer 102 as the deposition nucleus. The plated copper is not deposited on portions except for the first grooves 104, e.g., the surface of the first insulating layer 103. At this time, the thickness of the first plated copper 105 is preferably set to 50 μm, which is larger than the thickness of 40 μm of the first insulating layer 103, so that the plated copper 105 projects from the first grooves 104. This value is determined by considering the amount of the plated copper 105 that might be lost by a later toughening step or be melted by pretreatment for electric plating, and aims at preventing the roughening liquid from penetrating through the gaps between the first grooves 104 and the first plated copper 105 in the roughening treatment to spoil the underlying first ground layer 102 this phenomenon is generally called "halo").

Figure 1D:
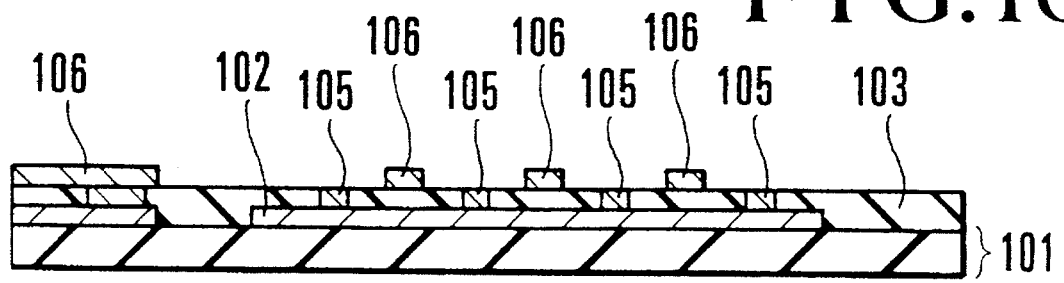

As shown in FIG. 1D, catalytic treatment, electroless copper plating, and electric copper plating are performed to plate copper on the first insulating layer 103 to a thickness of 20 μm, and circuits 106 are selectively formed by the subtractive scheme. At this time, in order to form the circuits 106 among the respective first grooves 104, the circuit width is set to 80 μm, the gap between the circuits 106 and the adjacent first plated copper 105 is set to 100 μm, and the mask film is aligned such that the first plated copper 105 and the circuits 106 will not contact each other. In this case, the circuits 106 have a wiring pattern parallel to the first grooves 104.

Figure 1E:
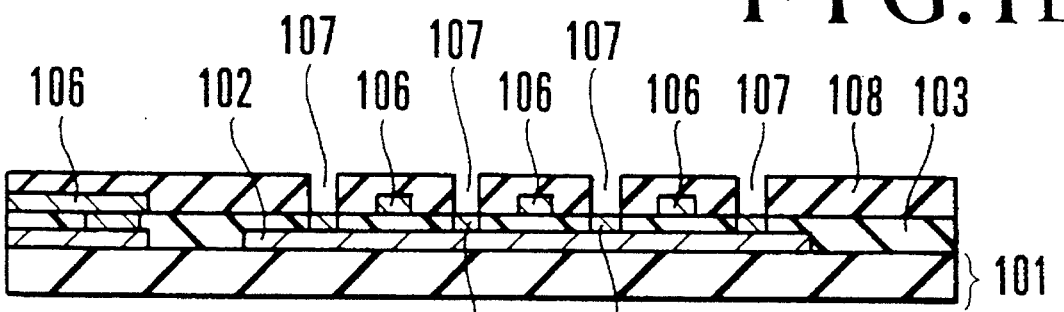

As shown in FIG. 1E, coating of the photosensitive resin, dry tack, exposure, and development are performed in accordance with the same manner as in formation of the first insulating layer 103, thereby forming second grooves 107 at the same positions as the first grooves 104. The non-exposed portion of the photosensitive resin is hardened to form a second insulating layer 108.

Figure 1F:
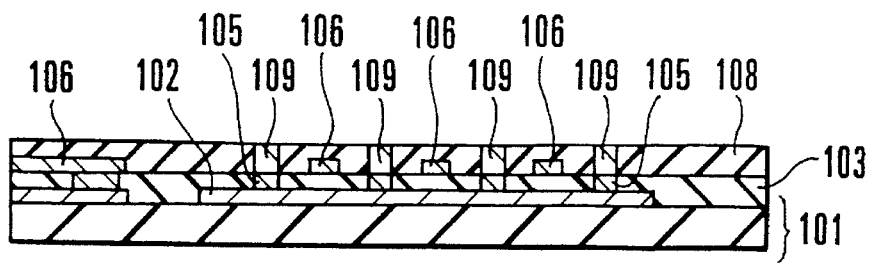

As shown in FIG. 1F, electroless copper plating is performed again to a thickness of 50 μm, thereby depositing second plated copper 109 in the second grooves 107.

Figure 1G:
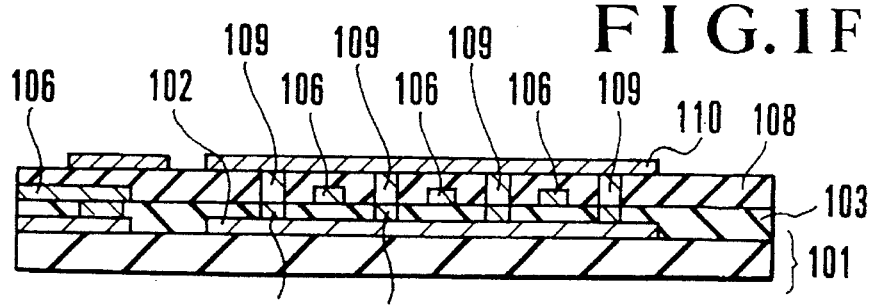

As shown in FIG. 1G, roughening, catalytic treatment, electroless copper plating, and electric copper plating are performed, and a second ground layer 110 is formed by the subtractive scheme. By the above steps, 100-μm wide side walls constituted by the first and second plated copper 105 and 109 and to be connected to the first and second ground layers 102 and 110 through the first and second insulating layers 103 and 108 are formed among the circuits 106 having a width of 80 μm and a pitch of 400 μm, thereby obtaining the circuits 106 having coaxial structures.

Figure 1H:
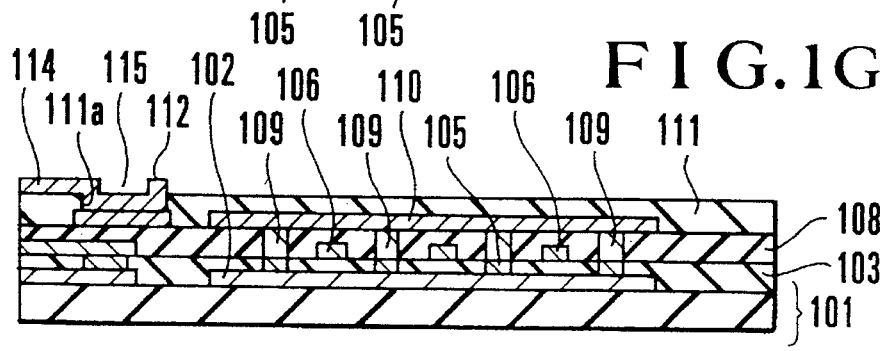

As shown in FIG. 1H, a 40-μm thick third insulating layer 111 serving as the surface layer is formed on the second insulating layer 108 and the second ground layer 110 in the same manner as in formation of the second insulating layer 108. At this time, holes 111a having a length of 1.5 mm and a width of 0.2 mm are formed in the third insulating layer 111 at positions respectively corresponding to parts mounting pads 112 in the same manner as in formation of the first and second grooves 104 and 107. Subsequently, roughening, catalytic treatment, electroless copper plating, and electric copper plating are performed. Then, a surface layer circuit 114 and the parts mounting pads 112 to be connected to the surface layer circuit 114 are selectively formed by etching. The parts mounting pads 112 are formed in the holes 111a that are formed in the third insulating layer 111 in advance, thereby obtaining the parts mounting pads 112 having recessed portions 115 having a depth of 40 μm, a width of 0.2 mm, a gap of 0.1 mm, and a length of 1.5 mm.

Figure 1I:
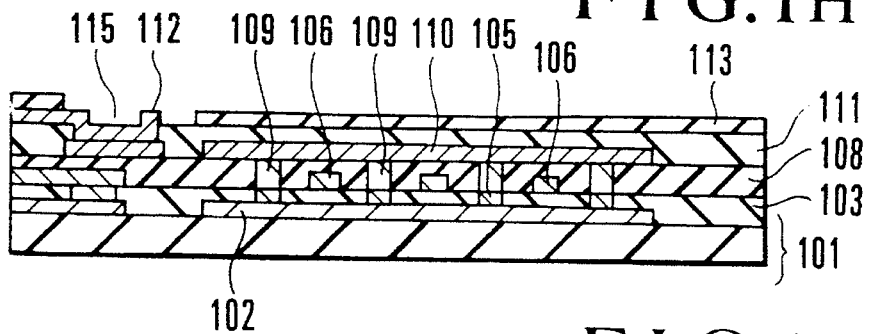

As shown in FIG. 1I, a solder resist layer 113 is formed on the third insulating layer 111 excluding the parts mounting pads 112 and on the surface layer circuit 114. The surfaces of the parts mounting pads 112 are subjected to rust preventive treatment called preflux. As a result, a multilayered printed wiring board having coaxial circuits in its inner layers and tile parts mounting pads 112 including the recessed portions 115 is obtained.

Figure 4A:
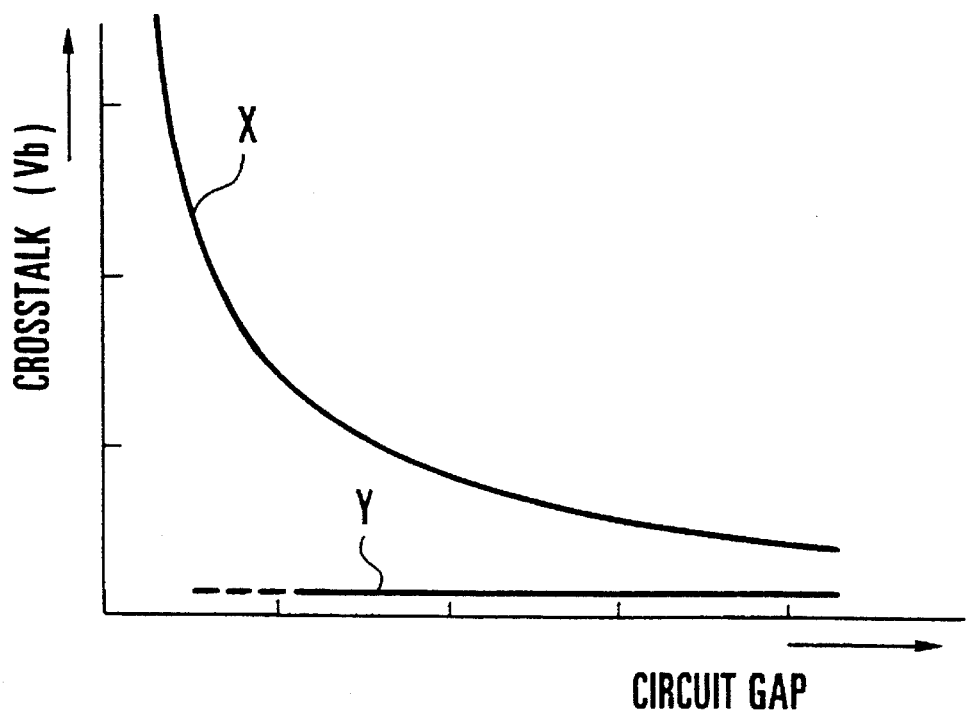
FIGS. 4A and 4B are graphs showing a relationship of a circuit gap, a parallel travel distance, and crosstalk between a multilayered printed wiring board according to the present invention and the conventional multilayered printed wiring board.
Figure 4B:
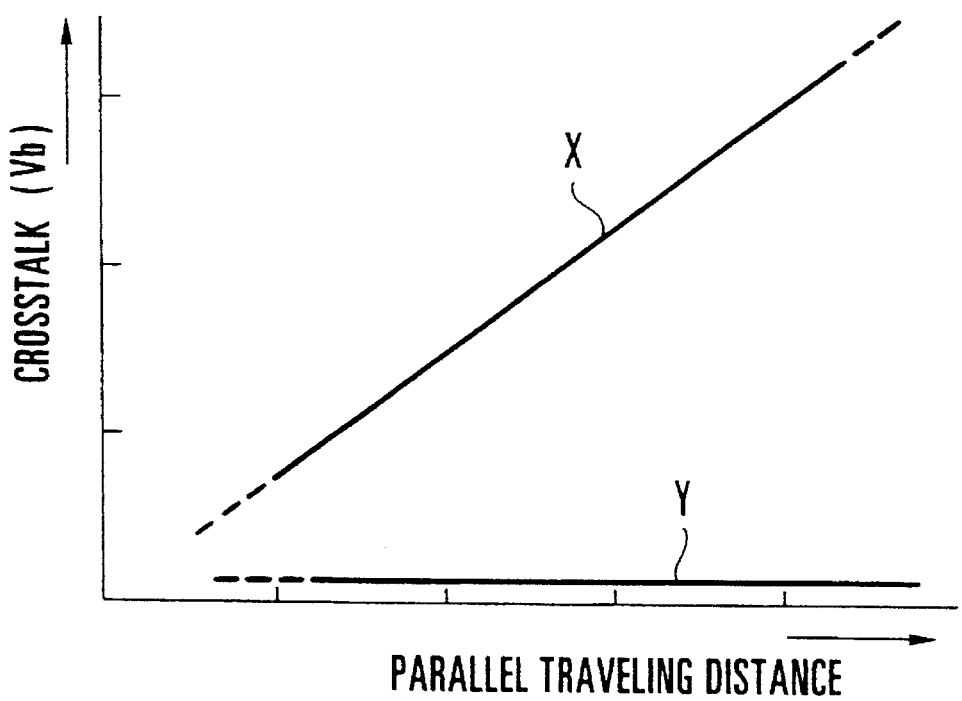

Surface mounting parts are soldered on this multilayered printed wiring board by reflow. At this time, tile surface mounting parts are preliminarily adhered by fitting the leads of the parts in the recessed portions 115 of the parts mounting pads 112. Hence, the positional precision of the leads of the parts is increased to have variations as small as ±30 μm. A rectangular wave is supplied to the coaxial circuits in the inner layers, and a signal in a circuit adjacent to these circuits is measured with an oscilloscope. As a result, as indicated by curves Y of the multilayered printed wiring board according to the present invention shown in FIGS. 4A and 4B, crosstalk caused by a signal in an adjacent circuit is not substantially generated.

Figure 2:
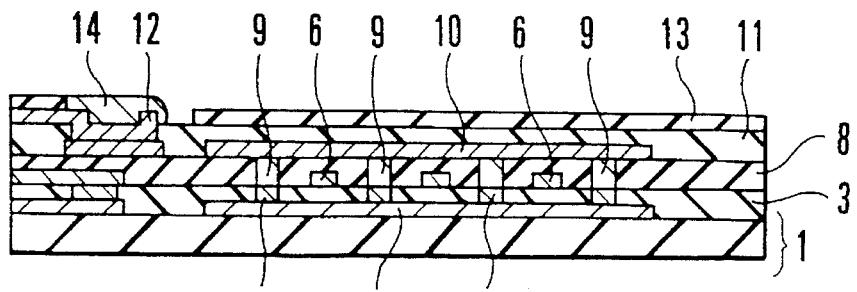
FIG. 2 is a sectional view of a multilayered printed wiring board showing a final step that explains a method of manufacturing a multilayered printed wiring board according to the second embodiment of the present invention.
Figure 3A:
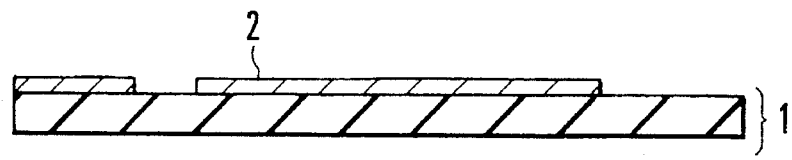
FIGS. 3A to 3G are sectional views showing an example of a conventional method of manufacturing a multilayered printed wiring board in the order of steps to be explained.
Figure 3B:
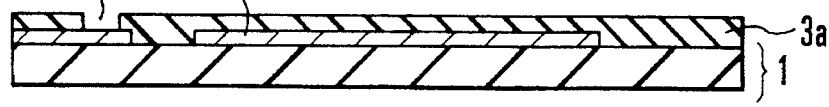
Figure 3C:
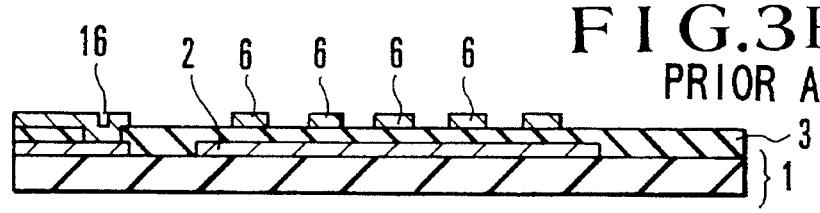
Figure 3D:
Figure 3E:
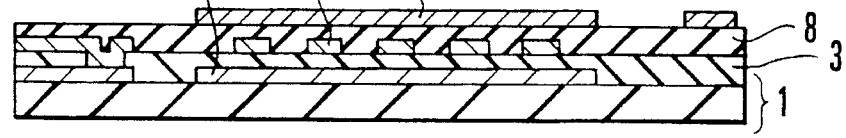
Figure 3F:
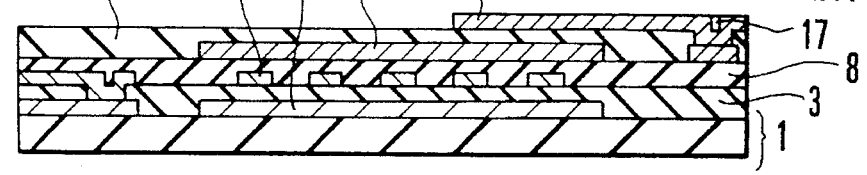
Figure 3G:
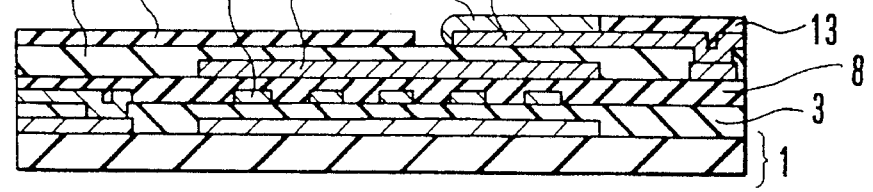

FIG. 2 is a sectional view of a multilayered printed wiring board showing a final step that explains the second embodiment of the present invention. Note that the manufacturing steps of this embodiment prior to the final step are the same as those shown in FIGS. 1A to 1I, and a detailed description thereof will be omitted.

In FIG. 2 following the step of FIG. 1I, a solder 14 is supplied into the recessed portions 115 of the parts mounting pads 12 by means of, e.g., the hot air leveler. More specifically, by using the hot air leveler, the board 1 is dipped in a molten solder, and after the board 1 is pulled up, high-temperature air is blown to the surface of the board 1 in order to remove an excessive solder 14, thereby preventing bridging between the parts mounting pads 112. Since the solder 14 filled in the recessed portions 115 of the parts mounting pads 12 will not easily be scattered even by an air-knife, its amount will not be greatly decreased. Thus, a large amount of solder 14 is held in the recessed portions 115 of the parts mounting pads 12.

Generally, upon reflow soldering, a solder paste is supplied to the parts mounting pad in advance by screen printing. However, as the pitch of the parts leads is decreased, printing of the solder paste becomes difficult. In the second embodiment, the solder 14 in an amount required for soldering the parts leads is held in the recessed portions 115 of the parts mounting pads 12. Therefore, printing of the solder paste as described above is not required, so that low-cost, high-yield soldering is enabled.

As has been described above, the multilayered printed wiring board according to the present invention has the following effects.

First, the multilayered printed wiring board according to the present invention has inner-layer circuits having coaxial structures. A signal flowing through one inner layer circuit is completely isolated by the surrounding ground layers and the side walls and will not adversely affect a signal flowing in the adjacent inner layer circuit. Thus, crosstalk is substantially eliminated, so that even a high-frequency signal can be transmitted without noise. Then, the gap between the adjacent inner layer circuits can be decreased, thereby obtaining a high-density wiring.

Second, since the leads of the parts can be fitted in the recessed portions of the parts mounting pads upon soldering, tile positional precision between the parts mounting pads and the leads of the mounting parts can be increased with variations as small as ±30 μm. Since the soldered portions are housed in the recessed portions and the solder projects from the recessed portions only low, solder bridging can be decreased. As a result, even a mounting part having leads having a pitch as small as 0.3 mm can be mounted.

What is claimed is:

1. A method of manufacturing a multilayered printed wiring board, comprising the steps of:

forming a first insulating layer on a board on which a first ground layer is formed;

selectively forming a first circuit pattern on said first insulating layer;

forming a second insulating layer on said first insulating layer and said first circuit pattern;

forming a second ground layer on said second insulating layer to oppose said first ground layer;

coating a resin on said second ground layer and said second insulating layer;

selectively forming a hole in the resin and hardening the resin, thereby forming a third insulating layer serving as a surface layer;

flattening said third insulating layer by polishing and toughening said third insulating layer; and selectively forming a second circuit pattern on said third insulating layer which has been roughened and forming a parts mounting pad having a recessed portion at a region of said third insulating layer where the hole is formed.

2. A method of manufacturing a multilayered printed wiring board, comprising the steps of:

forming a first insulating layer on a board on which a first ground layer is formed;

forming at least a pair of parallel first grooves in said first insulating layer to communicate with said first ground layer;

selectively filling a conductive metal in the first grooves by plating;

roughening a surface of said first insulating layer;

forming a first circuit pattern parallel to the first grooves between the first grooves in said first insulating layer which is roughened;

forming a second insulating layer on said first circuit pattern and on said first insulating layer;

forming at least a pair of second grooves at positions of said second insulating layer to overlap the first grooves;

selectively filling a conductive metal in the second grooves by plating;

roughening a surface of said second insulating layer;

forming a second ground layer on said second insulating layer and on the conductive metal in the second grooves to oppose said first ground layer;

forming a third insulating layer serving as a surface layer on said second ground layer and said second insulating layer; and selectively forming a second circuit pattern on said third insulating layer.

3. A method according to claim 2, wherein the steps of forming said first insulating layer and the first grooves are constituted by the step of coating a resin on said board on which said first ground layer is formed, the step of forming the first grooves in the resin, and the step of hardening the resin in which the first grooves are formed, and the steps of forming said second insulating layer and the second grooves are constituted by the step of coating a resin on said first insulating layer and on the conductive metal in the first grooves, the step of forming the second grooves in the resin, and the step of hardening the resin in which the second grooves are formed.

4. A method according to claim 2, further comprising the step of forming a hole at a predetermined region in said third insulating layer, and the step of forming a parts mounting pad having a recessed portion at a region of said third insulating layer including the hole.

* * * * *